(12) United States Patent
Romero

(10) Patent No.: US 9,817,083 B2
(45) Date of Patent: Nov. 14, 2017

(54) MAGNETIC FIELD SENSORS AND ASSOCIATED METHODS FOR REMOVING UNDESIRABLE SPECTRAL COMPONENTS

(75) Inventor: Hernan D. Romero, De Buenos Aires (AR)

(73) Assignee: Allegro MicroSystems, LLC, Worcester, MA (US)

( * ) Notice: Subject to any disclaimer, the term of this patent is extended or adjusted under 35 U.S.C. 154(b) by 911 days.

(21) Appl. No.: 13/542,103

(22) Filed: Jul. 5, 2012

(65) Prior Publication Data
US 2014/0009144 A1 Jan. 9, 2014

(51) Int. Cl.
G01R 33/07 (2006.01)
G01R 33/00 (2006.01)

(52) U.S. Cl.
CPC .......... G01R 33/07 (2013.01); G01R 33/0041 (2013.01)

(58) Field of Classification Search
CPC ...... H03F 3/387; H03F 3/393; H03F 3/45968; H03F 3/45973; H03F 3/45977; H03F 2200/273; H03F 2200/261; G01D 5/16; G01D 5/2283; G01D 5/145; G01D 5/22; G01D 5/2208; G01D 5/2216; G01D 5/2225; G01D 5/2233; G01D 5/2241; G01D 5/225; G01D 5/2258; G01D 5/2266; G01D 5/2275; G01D 5/20; G01D 5/2006; G01D 5/2013; G01D 5/202; G01D 5/2026; G01D 5/2033; G01D 5/204; G01D 5/2046; G01D 5/2053; G01D 5/206; G01D 5/14; G01D 5/142; G01D 5/147; G01B 7/305; G01B 7/31; G01B 7/312; G01B 7/30; G01B 7/02; G01B 7/023; G01B 7/04; G01B 7/046; G01B 7/14; H03M 3/376; H03M 3/34; H01L 43/00; H01L 43/06; H01L 43/08; G01R 33/0094; G01R 33/0041; G01R 33/07; G01R 33/072; G01R 33/075; G01R 33/077; G01R 15/20; G01R 15/202; G01R 15/205
See application file for complete search history.

(56) References Cited

U.S. PATENT DOCUMENTS

| | | | |
|---|---|---|---|
| 6,154,027 A * | 11/2000 | Alexander et al. | 324/251 |
| 7,292,095 B2 | 11/2007 | Burt et al. | |
| 7,764,118 B2 | 7/2010 | Kusuda et al. | |
| 7,990,209 B2 | 8/2011 | Romero | |
| 8,542,010 B2 | 9/2013 | Cesaretti et al. | |
| 8,559,554 B2 | 10/2013 | Vossiek et al. | |
| 8,680,846 B2 | 3/2014 | Cesaretti et al. | |
| 9,201,122 B2 | 12/2015 | Cesaretti et al. | |
| 2003/0102909 A1 | 6/2003 | Motz | |
| 2003/0225539 A1* | 12/2003 | Motz et al. | 702/107 |

(Continued)

OTHER PUBLICATIONS

Cesaretti et al.; "Circuits and Methods for Self-Calibrating or Self-Testing a Magnetic Field Sensor;" U.S. Appl. No. 13/095,371, filed Apr. 27, 2011; 62 pages.

(Continued)

*Primary Examiner* — David M. Schindler
(74) *Attorney, Agent, or Firm* — Daly, Crowley, Mofford & Durkee, LLP

(57) ABSTRACT

Magnetic field sensors and associated techniques use a Hall effect element in a chopping arrangement in combination with a feedback path configured to reduce undesirable spectral components generated by the chopping.

26 Claims, 10 Drawing Sheets

(56) References Cited

U.S. PATENT DOCUMENTS

2007/0114988 A1* 5/2007 Rossmann et al. ......... 324/207.2
2010/0321105 A1* 12/2010 Romero ..................... 327/554
2011/0018533 A1* 1/2011 Cesaretti et al. ............ 324/251
2011/0215955 A1* 9/2011 Motz et al. ................. 341/110
2014/0077873 A1* 3/2014 Motz et al. ..................... 330/9

OTHER PUBLICATIONS

Wu et al.; "A Chopper Current-Feedback Instrumentation Amplifier with a 1mHz 1/f Noise Corner and an AC-Coupled Ripple-Reduction Loop;" 2009 IEEE International Solid-State Circuits Conference; ISSCC 2009/Session 19/Analog Techniques/19.1; Feb. 2009; pp. 322-324.
Bryant, James; "Multipliers vs. Modulators"; Analog Dialogue 47/06; Jun. 1, 2013; pp. 1-2 (2 pages).
Smith; "Chapter 9: Applications of the DFT/Spectral Analysis of Signals;" The Scientist and Engineer's Guide to Digital Signal Processing, Spectral Analysis Signals; Jan. 1, 1997; 11 pages.
Patent Database Search Results: ACLM/"Spectral Line" in US Patent Collection; downloaded on Jul. 1, 2016; 3 pages.
"Amplitude Modulation with Square-Waves"; by Profesor Bernd-Peter Paris: dated Mar. 3, 1998; downloaded from www.spec.gmu.edu on Jul. 5, 2016; 1 page.
"Speech Acoustics: Spectral Analysis of Sound"; by Robert Mannell: downloaded from http://clas.mq.edu.au on Jul. 1, 2016; 10 pages.
"FFT Fundamentals (Sound and Vibration Measurement Suite)"; Nov. 2008 edition; downloaded from http://zone.ni.com on Jul. 1, 2016; 4 pages.
"Spectral Lines", downloaded from http://www.cv.nrao.edu on Jul. 1, 2016; 10 pages.
"Spectral Analysis of Signals", by Petre Stoica and Randolph Moses; 2005 edition Chapter 4; 65 pages.
"Amplitude Modulation"; downloaded from https://en.wikipedia.org/wiki/Amplitude_modulation on Mar. 9, 2017; 11 pages.
"Quantization (signal processing)"; downloaded from https://en.wikipedia.org/wiki/Quantization_(signal_processing) on Mar. 9, 2017; 13 pages.
"Johnson-Nyquist noise"; downloaded from https://en.wikipedia.org/wiki/Johnson%E2%80%93Nyquist_noise on Mar. 9, 2017; 7 pages.
"Communication Systems/Amplitude Modulation"; downloaded from https://en.wikibooks.org/wiki/Communication_Systems/Amplitude_Modulation on Mar. 9, 2017; 14 pages.
"Frequency domain"; downloaded from https://en.wikipedia.org/wiki/Frequency_domain on Mar. 9, 2017; 3 pages.
"Spectral density"; downloaded from https://en.wikipedia.org/wiki/Spectral_density on Mar. 9, 2017; 9 pages.

* cited by examiner

MAGNETIC FIELD SENSORS AND ASSOCIATED METHODS FOR REMOVING UNDESIRABLE SPECTRAL COMPONENTS

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to a magnetic field sensor having a Hall element and electronics to reduce undesirable spectral components generated when the Hall Effect element is chopped.

BACKGROUND OF THE INVENTION

As is known, there are a variety of types of magnetic field sensing elements, including, but not limited to, Hall Effect elements, magnetoresistance elements, and magnetotransistors. As is also known, there are different types of Hall Effect elements, for example, planar Hall elements, vertical Hall elements, and circular vertical Hall elements (CVH). As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

Hall Effect elements generate an output voltage proportional to a magnetic field. In contrast, magnetoresistance elements change resistance in proportion to a magnetic field. In a circuit, an electrical current can be directed through the magnetoresistance element, thereby generating a voltage output signal proportional to the magnetic field.

Magnetic field sensors, which use magnetic field sensing elements, are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor that senses a magnetic field density of a magnetic field. Particular magnetic field sensor arrangements are used as examples herein. However, the circuits and techniques described herein apply also to any magnetic field sensor.

It is known that Hall Effect elements exhibit an undesirable DC offset voltage. Techniques have been developed to reduce the DC offset voltage, while still allowing the Hall Effect element to sense a DC magnetic field. One such technique is commonly referred to as "chopping." Chopping is a technique by which a Hall Effect element is driven in two or more different directions, and outputs are received at different output terminals as the Hall Effect element is differently driven. With chopping, offset voltages of the different driving arrangements tend to cancel toward zero.

However, the chopping tends to generate undesirable spectral components (i.e., frequency components in the frequency domain). The undesirable spectral components can be removed with filters.

Circuits that both chop a Hall element and that use one or more filters to remove undesirable spectral components is described in U.S. patent application Ser. No. 13/095,371, filed on Apr. 27, 2011, entitled "Circuits and Methods for Self-Calibrating or Self-Testing a Magnetic Field Sensor," assigned to the assignee of the present invention, and which is incorporated by reference herein in its entirety.

While convention arrangements that use filters can effectively reduce the undesirable spectral components, it will be understood that the filters tend to reduce a bandwidth or a response time of the magnetic field sensors that use filters.

It would be desirable to provide a magnetic field sensor that uses a Hall Effect element in a chopping arrangement, and that can reduce undesirable spectral components generated by the chopping, but that does not reduce a bandwidth or response time of the magnetic field sensor.

SUMMARY OF THE INVENTION

The present invention provides a magnetic field sensor that uses a Hall Effect element in a chopping arrangement, and that can reduce undesirable spectral components generated by the chopping, but that does not reduce a bandwidth or response time of the magnetic field sensor.

In accordance with one aspect of the present invention, a magnetic field sensor includes a magnetic field sensing element configured to generate an electronic signal in response to a magnetic field. The magnetic field sensor also includes an N-phase modulator coupled to receive the electronic signal and configured to generate a modulated signal having a plurality of frequency components at different frequencies. At least two of the plurality of frequency components correspond to at least two undesirable frequency components and one of the plurality of frequency components corresponds to a desirable frequency component. The desirable frequency component comprises a magnetic field signal representative of the magnetic field. The magnetic field sensor also includes a primary circuit path coupled to receive the modulated signal and to process the modulated signal to generate an output signal representative of the magnetic field signal. The magnetic field sensor also includes a feedback circuit path coupled at both ends of the feedback circuit path to the primary circuit path and forming a feedback loop. The feedback circuit path is configured to generate a feedback signal and is coupled to add the feedback signal to the primary circuit path to cancel the at least two undesirable frequency components.

In accordance with another aspect of the present invention, a method of processing a signal in a magnetic field sensor includes generating a magnetic field signal with a magnetic field sensor in response to a magnetic field. The method also includes modulating the magnetic field signal with an N-phase modulator coupled to receive the magnetic field signal and configured to generate a modulated signal having a plurality of frequency components at different frequencies. At least two of the plurality of frequency components correspond to at least two undesirable frequency components and one of the plurality of frequency components corresponds to a desirable frequency component. The method also includes processing the modulating signal with a primary circuit path coupled to receive the modulated signal. The primary circuit path is configured to generate an output signal representative of the desirable frequency component. The method also includes generating a feedback signal with a feedback circuit path and adding the feedback signal to the primary circuit path to cancel the at least two undesirable frequency components.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
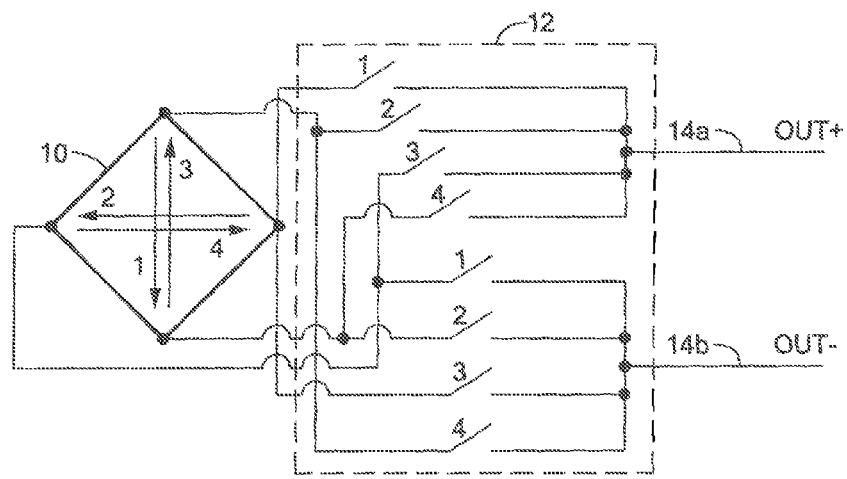
FIG. 1 is a block diagram showing a Hall Effect element and a switching circuit coupled in a four-phase chopping arrangement.

Before describing the present invention, some introductory concepts and terminology are explained. As used herein, the term "magnetic field sensing element" is used to describe a variety of types of electronic elements that can sense a magnetic field. The magnetic field sensing elements can be, but are not limited to, Hall Effect elements, magnetoresistance elements, or magnetotransistors. As is known, there are different types of Hall Effect elements, for example, planar Hall elements, vertical Hall elements, and circular vertical Hall (CVH) elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

As is known, some of the above-described magnetic field sensing elements tends to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, most, but not all, types of magnetoresistance elements tend to have axes of maximum sensitivity parallel to the substrate and most, but not all, types of Hall elements tend to have axes of sensitivity perpendicular to a substrate.

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor (e.g., a linear magnetic field sensor) that senses a magnetic field density of a magnetic field. Linear magnetic field sensors are used as examples herein. However, the circuits and techniques described herein apply also to any magnetic field sensor capable of detecting a magnetic field.

As used herein, the term "magnetic field signal" is used to describe any circuit signal that results from a magnetic field experienced by a magnetic field sensing element.

Switching circuit described herein are operable to change positions of spectral lines of a signal, the changes of positions described for example, in conjunction with FIGS. 6-23.

While circuits are described below that use Hall elements in chopped arrangements and that have certain circuits to reduce undesirable spectral components resulting from the chopping, similar techniques can be used with other magnetic field sensors that support N-phase chopping, in order to reduce undesirable spectral components no matter what their source.

Referring to FIG. 1, an exemplary Hall Effect element 10 is chopped by operation of an N-Phase modulator circuit 12, here shown to be a four phase modulator circuit 12. The four phase modulator circuit 12 can include a plurality of switches coupled to the Hall Effect element 10 in four different arrangements. The plurality of switches can provide a differential output signal 14a, 14b.

In operation, and in accordance with four-phase (i.e., 4×) chopping, the Hall Effect element 10 can be driven with currents in four different directions represented by four arrows numbered 1-4. At the same time, respective pairs of the switches are closed. For example, when the current through the Hall Effect element 10 is in a direction represented by the arrow labeled 1, two switches also labeled 1 are closed and all of the other switches are open. There are four such arrangements of drive currents and pairs of switch closures indicated. For such arrangements occur in sequence, and thus, they are often referred to as chopping phases. The chopping phases are sequenced at a rate related to a chopping frequency, described more fully below.

It will be understood that each chopping phase in sequence contributes to the differential output signal 14a, 14b. It will also be understood that by proper sequencing of the drive currents and the switch pair closures, some components of the resulting differential output signal 14a, 14b can shift to one or more frequencies related to the chopping frequency. Depending upon phasing, the components that are shifted in frequency include either the DC offset of the Hall Effect element 10 or a signal (Bext) corresponding to a magnetic field sensed by the Hall Effect element 10.

In examples described more fully below, a chopping phase sequence is described that results in the signal corresponding to the magnetic field sensed by the Hall Effect element 10 being shifted to a frequency related to the chopping frequency.

Figure 2:
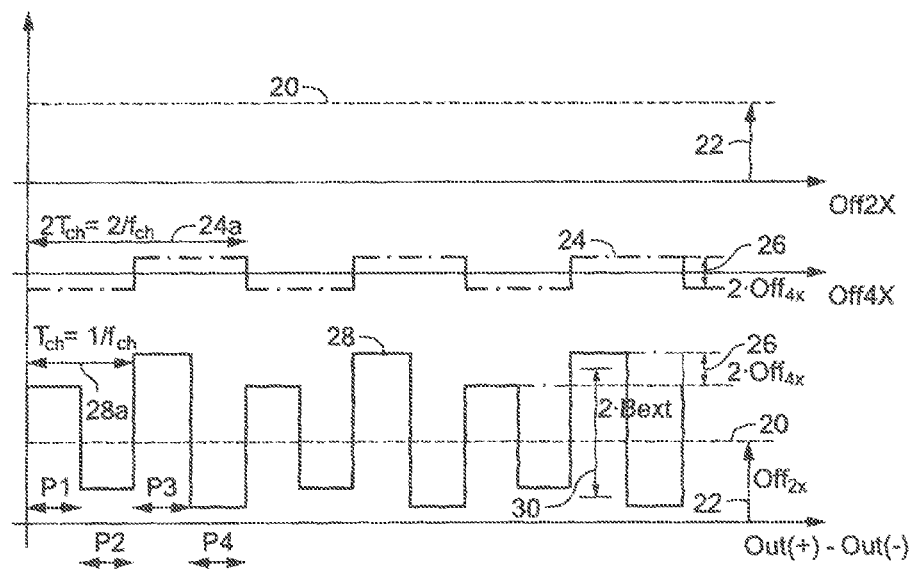
FIG. 2 is a set of graphs showing signals within the circuits of FIG. 1.

Referring now to FIG. 2, three signals, 20, 24, 28 are shown in the time domain. Horizontal axes have scales in units of time in arbitrary units and a vertical axis has a scale in units of volts in arbitrary units.

The signal 20 represents a DC offset voltage component of the Hall Effect element 10 of FIG. 1, which remains at baseband within the differential output signal 14a, 14b of FIG. 1. The DC offset voltage 20 has a magnitude 22.

The signal 24 corresponds to one of the higher frequency spectral components (occurring at a frequency equal to half of the chopping frequency, fchop/2 (and also at odd harmonics thereof, at lower amplitude)), but shown as an AC signal in the time domain, of the differential output signal 14a, 14b generated by the chopping of FIG. 1. An arrow 26 is indicative of twice the amplitude of this component.

In operation of the chopping arrangement of FIG. 1, the signals 20 and 24 exist together in combination with other spectral components.

The signal 28 includes the DC signal component 20, the AC signal component 24, and also another AC signal component corresponding to the magnetic field sensed by the Hall Effect element 10 of FIG. 1, which occurs at a frequency of fchop. An arrow 30 is indicative of twice an amplitude of the AC signal component corresponding to the magnetic field sensed by the Hall Effect element 10.

It should be appreciated that the steps of the signal 28 correspond to samples of signals generated by the Hall element 10 of FIG. 1 within the differential output signal 14a, 14b of FIG. 1 as the plurality pairs of switches close and open in sequence. As indicated, one period of the sampled signal 28 has a "chopping period," $T_{ch}=1/f_{ch}$, where $f_{ch}$ is a so-called "chopping frequency," also referred to herein as fchop. It should be appreciated that the chopping period, $T_{ch}$, corresponds to only two samples out of a four sequential samples provided by the switching circuit 12 of FIG. 1. Nevertheless, these are the conventional meanings of the chopping period and chopping frequency, fchop.

It should be understood that the AC signal component corresponding to the magnetic field sensed by the Hall effect element 10, i.e., at the frequency of fchop, is the only desired signal component within the signal 28, and the DC offset signal 20 and the AC signal component 24, at the frequency of fchop/2, are not desired. Thus it is desirable to remove the DC component 20 and the AC signal component 24 from the signal 28. Techniques described below can remove the undesirable signal components Within the signal 28, it should be appreciated that the undesirable AC signal component 24, as shown, generates a signal component with magnitude 26. Furthermore, it should be appreciated that the undesirable DC signal component 20 generates a DC signal component with a magnitude 22, i.e., an undesirable DC offset of the signal 28.

Thus, it should be appreciated then that the signal 28 has all three signal components (and corresponding spectral components in the frequency domain), two of which are undesirable. The signal 28 can be the same as or similar to the differential signal 14a, 14b of FIG. 1.

Referring briefly to FIG. 1, for four-phase chopping as shown, there are four clock signals controlling four respective pairs of switches within the switching circuit 12, and there are four respective directions of drive currents within the Hall element 10. With the above definition of chopping frequency, fchop, each clock has a frequency of 2fchop/N, where N is a number of phases in the chopping. For four-phase chopping, N=4, and the frequency of each one of the clocks is fchop/2. Referring again to FIG. 2, in other words, the period, $T_{ch}$, at the chopping frequency corresponds to only two of N sequential samples provided by N-phase chopping.

Figure 3:
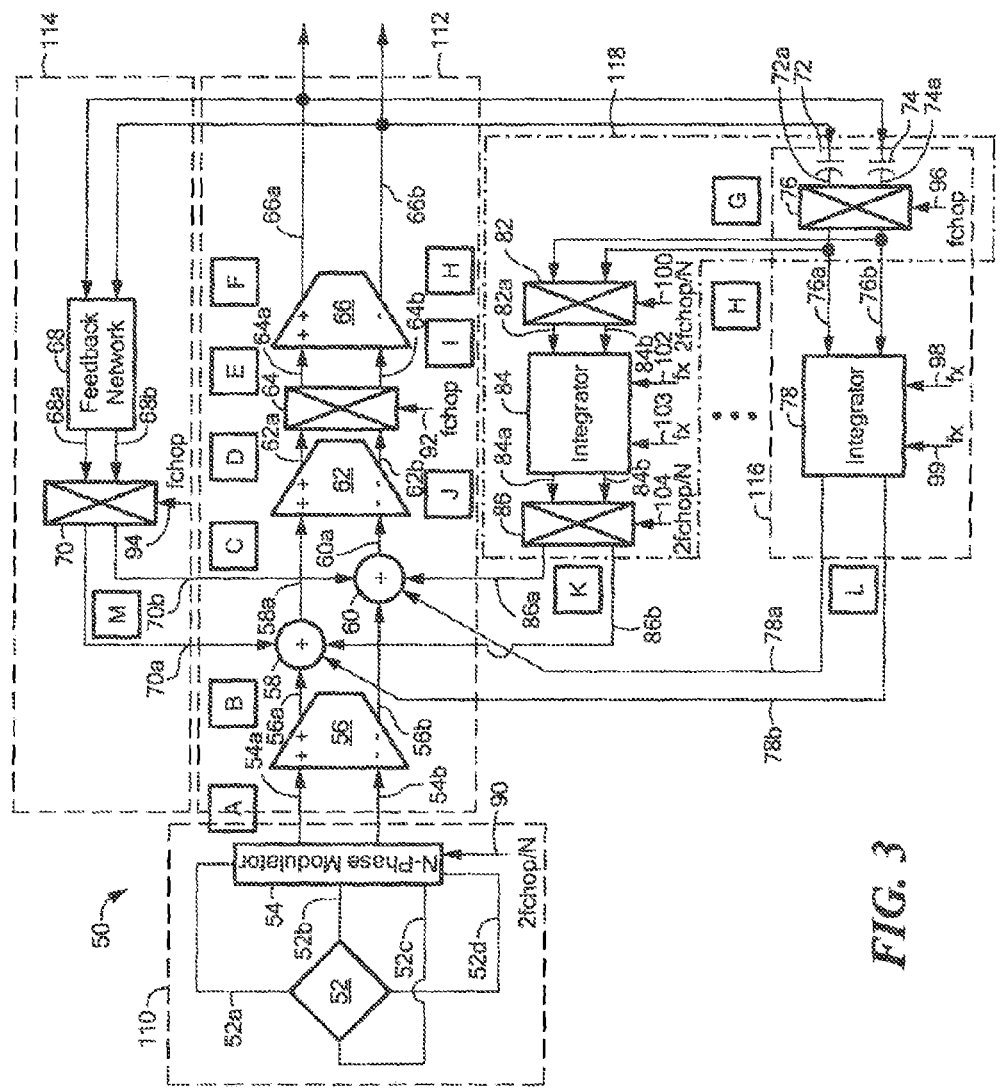
FIG. 3 is a block diagram showing an exemplary magnetic field sensor having a Hall effect element used in a chopping arrangement, having a primary signal path, and having a feedback circuit path configured to reduce undesirable spectral components in the primary signal path that results from the chopping.

Referring now to FIG. 3, a magnetic field sensor 50 includes a Hall Effect element 52 coupled to an N-phase modulator circuit 54 in a chopped circuit 96. The Hall Effect element 52 and the N-phase modulator circuit can be the same as or similar to the Hall Effect element 10 and the N-phase modulator 12 of FIG. 1. A generalized N-phase chopping arrangement is shown in FIG. 3 and is also used in further examples below. It should be understood that many different chopping arrangements can be used, including, but not limited to, a 2×, a 4×, and an 8× chopping arrangement, where N=2, 4, or 8.

The N-phase modulator circuit 54 can be configured to generate a differential output signal 54a, 54b, which can be the same as or similar to the differential output signal 14a, 14b of FIG. 1. For easy reference in figures below, the differential signal 54a, 54b is labeled as a signal A, and other differential signal described below are labeled with other letters.

A primary circuit path 112, and, in particular an amplifier 56, can be coupled to receive the differential signal 54a, 54b and configured to generate an amplified differential output signal 56a, 56b, which is labeled as a signal B. In some embodiments, the amplifier 56 is a transconductance amplifier.

A summing node 58 can be coupled to receive the signal 56a and another summing node 60 can be coupled to receive the signal 56b. The summing nodes 58, 60 can also be coupled to receive other signals described more fully below.

The summing nodes 58, 60 are configured to provide a differential signal 58a, 60a, which is labeled as a signal C.

Another amplifier 62 is coupled to receive the differential signal 58a, 60a and configured to generate an amplified signal 62a, 62b, which is labeled as a signal D. In some embodiments, the amplifier 62 is also a transconductance amplifier.

A switching circuit 64 can be coupled to receive the differential signal 62a, 62b and configured to generate a differential switched signal 64a, 64b, which is labeled as a signal E.

Another amplifier 66 is coupled to receive the differential switched output signal 64a, 64b and configured to generate another differential amplified signal 66a, 66b, which is labeled as a signal F. In some embodiments the amplifier 66 is a transconductance amplifier.

While transconductance amplifiers are described above, in other embodiments, the various amplifiers can be voltage amplifiers.

The differential amplified signal 66a, 66b can correspond to a differential output signal from the magnetic field sensor 50. It is desirable that the differential output signal 66a, 66b consist only of signal components directly related to that magnetic field which the Hall Effect element 52 senses, and not include undesirable signal components, for example, a DC offset component or other signal components described above in conjunction with FIG. 2.

The primary circuit path 112 can be used in conjunction with a gain feedback path 114. In general, the gain feedback path 114 is used to control and stabilize a gain of the primary circuit path 112. The gain feedback path 114 can include a feedback network 68 coupled to receive the differential output signal 66a, 66b and configured to generate a differential signal 68a, 68b. The feedback network 68 can be comprised, for example, of passive circuit elements, for example, resistors.

The gain feedback path 114 can also include a switching circuit 70 coupled to receive the differential signal 68a, 68b and configured to generate a differential switched signal 70a, 70b, which is labeled as a signal M. The summing circuit 58 can be coupled to receive the signal 70a, and the summing circuit 60 can be coupled to receive the signal 70b, providing a feedback arrangement.

The magnetic field sensor 50 can also include one or more feedback circuits. Here shown are a first feedback circuit 116 and an Mth feedback circuit 118. Taken together, the feedback circuits 116, 118 form a so-called "feedback circuit path," which is coupled at both ends to the primary circuit path 112, so as to form a feedback loop.

There are N/2 such feedback circuits within the feedback circuit path, where N equals the number of phases in the chopping of the Hall Effect element 52. Thus, M=N/2. For N=4, i.e., for four phase (4×) chopping, there are two such feedback circuits within the feedback circuit path. However, for 2× chopping, there is only one feedback circuit, i.e., the feedback circuit 116, within the feedback circuit path. As described above, there can be any number of phases in the chopping of the Hall Effect element 52, and any resulting number of feedback circuits within the feedback circuit path.

The first feedback circuit 116 can include first and second capacitors 72, 74, respectively, coupled to receive the differential output signal 66a, 66b. At opposite ends of the two capacitors 72, 74, a differential signal 72a, 74a is generated, which is labeled as a signal G, and which has no DC signal component, since the DC component is blocked by the two capacitors 72, 74.

The first feedback circuit 116 can also include a switching circuit 76 coupled to receive the differential signal 72a, 74 and configured to generate a differential switched signal 76a, 76b, which is labeled as a signal H. An integrator 78 is coupled to receive the differential switched signal 76a, 76b and configured to generate a differential integrated signal 78a, 78b, which is labeled as a signal L. The summing circuit 58 can be coupled to receive the signal 78b and the summing circuit 60 can be coupled to receive the signal 78a, or vice versa.

The Mth feedback circuit 118 can include a switching circuit 82 coupled to receive the differential signal 76a, 76b and configured to generate a differential switched signal 82a, 82b, which is labeled as a signal I. An integrator 84 can be coupled to receive the differential switched signal 82a, 82b and configured to generate a differential integrated signal 84a, 84b, which is labeled as a signal J. A switching circuit 86 can be coupled to receive the differential integrated signal 84a, 84b and configured to generate a differential switched signal 86a, 86b, which is labeled as a signal K. The summing circuit 58 can be coupled to receive the signal 86b and the summing circuit 60 can be coupled to receive the signal 78a, or vice versa.

It should be recognized that the differential signal 78a, 78b and the differential switched signal 86a, 86b are added to signals within the primary circuit path 112. It will become apparent from discussion below that the differential signal 78a, 78b can cancel some undesirable signal components within the primary circuit path 112 and, in some embodiments, the differential switched signal 86a, 86b can cancel some other undesirable signal components within the primary circuit path 112.

In some embodiments, the integrators 78, 84 are continuous, i.e., un-sampled, integrators, which can be either active or passive. Both active and passive integrator structures are known.

In other embodiments, the integrators 78, 84 can be switched capacitor integrators described more fully below in conjunction with FIG. 5B. Switched capacitor integrators require clock signals. Thus, clock signals 98, 99, 102, 103 are shown to be received by the integrators 78, 84, respectively. The clock signals 98, 99, 102, 103 can be at any frequency, fx. However, as is known, any sampled system generates nulls in their transfer function at a clock frequency and at higher harmonics thereof. Therefore, it may be desirable to select a frequency of the clock signals 98, 99, 102, 103 such that nulls occur at particular frequencies, for example, at frequencies of fchop or fchop/2. The clock signals 98, 99, 102, 103 are described more fully below in conjunction with FIG. 5C.

The switching circuits 82, 86 can be controlled by clock signals 100, 104, respectively, with frequencies of 2fchop/N. The switching circuit 76 can be controlled by a clock signal 96 with a frequency of fchop. Reasons for the selection of particular clock frequencies will become more apparent below in conjunction with FIGS. 6-23.

Operation of the magnetic field sensor 50 is described in conjunction with FIGS. 6-23 below.

Figure 4:
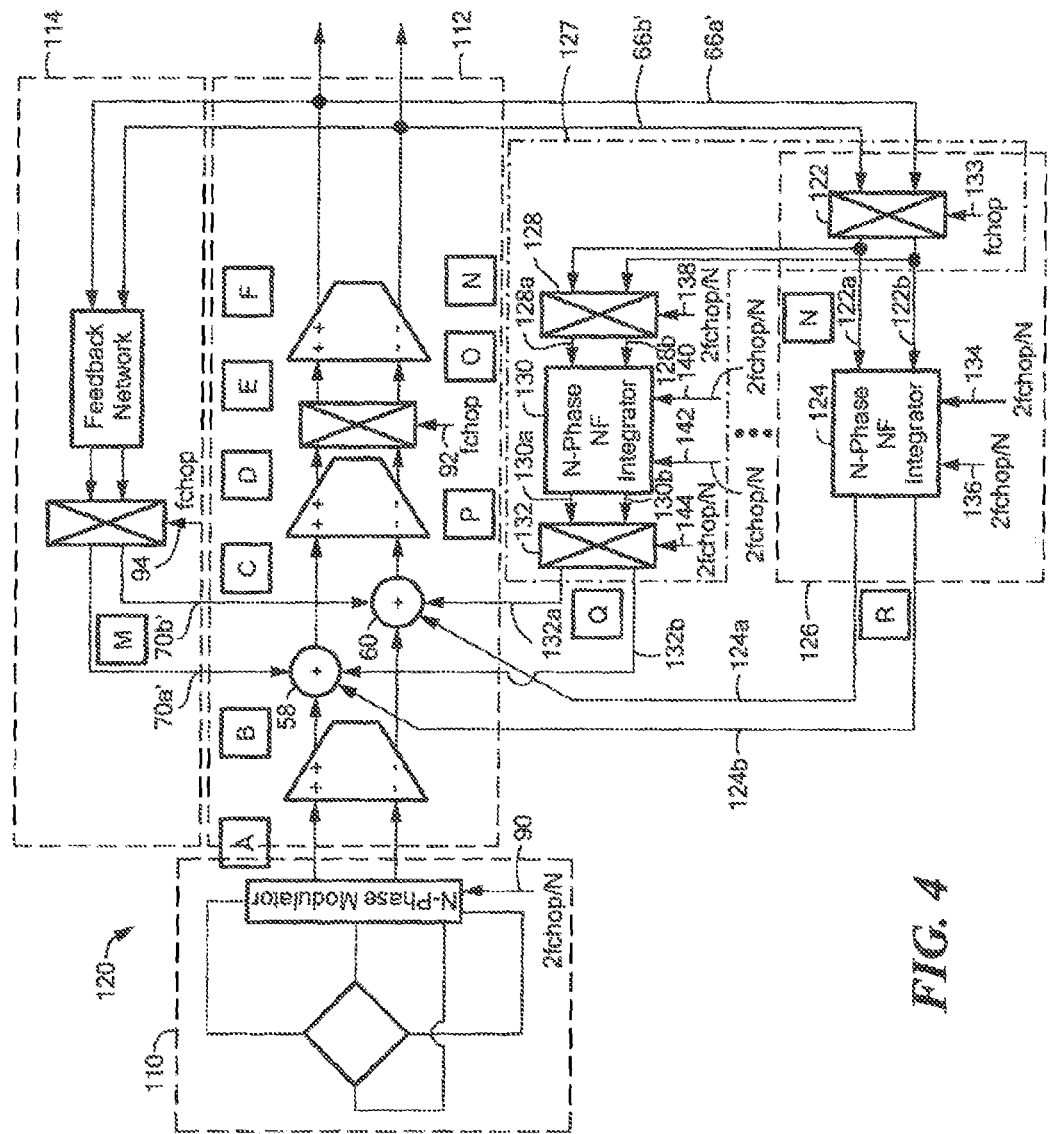
FIG. 4 is a block diagram showing another exemplary magnetic field sensor, having a primary signal path, and having a Hall effect element used in a chopping arrangement and having a feedback circuit path configured to reduce undesirable spectral components that results from the chopping.

Referring now to FIG. 4, in which like elements of FIG. 3 are shown having like reference designations, another magnetic field sensor 120 can include the chopping circuit 110, the primary circuit path 112, and the gain feedback circuit 114. However, here shown, the differential output signal 66a', 66b' is shown with prime symbols to indicate that the differential output signal 66a', 66b' is very much like the differential output signal 66a, 66b of FIG. 3, but also that it differs slightly due to differences in feedback circuits described below. For similar reasons, the gain feedback signal 70a', 70b' is shown with prime symbols.

The magnetic field sensor 120 can include a first feedback circuit 126 and an Mth feedback circuit 127, which together form of feedback circuit path coupled at both ends to the primary circuit path 112 to form a feedback loop. As described above in conjunction with FIG. 3, M=N/2.

The first feedback circuit 126 is similar to the feedback circuit 116 of FIG. 3. However, the first feedback circuit 126 does not include capacitors 72, 74, and it also includes a different type of integrator.

The first feedback circuit 126 includes a switching circuit 122 coupled to receive the differential output signal 66a', 66b' and configured to generate a differential switched signal 122a, 122b, which is labeled as a signal N. An N-phase switched capacitor notch filter integrator 124 is coupled to receive the differential switched signal 122a, 122b and configured to generate a differential integrated signal 124a, 124b, which is labeled as a signal R. Examples of switched capacitor notch filter integrators can be found, for example, in U.S. Pat. No. 7,990,209, issued Aug. 2, 2011, assigned to the assignee of the present invention, and incorporated by reference herein in its entirety. Also, an example of a switched capacitor notch filter integrator is shown and described below in conjunction with FIGS. 5, 5A, and 5D.

In general, notches in the transfer function of a switched capacitor notch filter integrator can be controlled by a separate clock signal, i.e., a redistribution or averaging clock signal, apart from a primary sampling clock signal. Thus, the redistribution clock provides an enhanced ability to position notches in a corresponding transfer function, as further described below.

The summing circuit 58 can be coupled to receive the signal 124b and the summing circuit 60 can be coupled to receive the signal 124a, or vice versa.

The Mth feedback circuit 127 can include a switching circuit 128 coupled to receive the differential switched signal 122a, 122b and configured to generate a differential switched signal 128a, 128b, which is labeled as a signal O.

An N-phase switched capacitor notch filter integrator 130 can be coupled to receive the differential switched signal 128a, 128b and configured to generate a differential integrated signal 130a, 130b, which is labeled as a signal P. A switching circuit 132 can be coupled to receive the differential integrated signal 130a, 130b and configured to generate a differential switched signal 132a, 132b, which is labeled as a signal Q.

The summing circuit 158 can be coupled to receive the signal 132b and the summing circuit 60 can be coupled to receive the signal 132a.

The switched capacitor notch filter integrators 124, 130 can be coupled to receive sample clock signals 134, 138, respectively at a frequency of 2fchop/N and also redistribution clock signals 136, 140, respectively, at a frequency of 2fchop/N. The sample clock signals 134, 140 are each comprised of four clock signals at different phases. The four different phases are described more fully below in conjunction with FIGS. 5 and 5A.

The switching circuits 128, 132 can be switched with clock signals 138, 144, respectively, at a frequency of 2fchop/N. The switching circuit 122 can be switched with a clock signal 133 at a frequency of fchop. Reasons for the selection of frequencies will become more apparent below in conjunction with FIGS. 6-23.

Operation of the magnetic field sensor 120 is described in conjunction with FIGS. 6-23 below.

The N-phase switched capacitor notch filter integrators 124, 130 of FIG. 4 have particular advantages over simple integrators 78, 84 (linear or switched capacitor types) described above in conjunction with FIG. 3. It will be appreciated from discussion below in conjunction with spectral plots in FIGS. 6-23, that an ability to position notches of the N-phase switched capacitor notch filter integrators 124, 130 (e.g., by way of the redistribution clock signals described above) provides the ability to remove signal components that are not intended to be integrated. Accordingly, it will be appreciated that the AC coupling capacitors 72, 74 of FIG. 3 are not required. Furthermore, the ability to place notches at frequencies selected to remove all spectral lines that are not intended to be integrated (i.e., undesirable spectral components) avoids using an integrator with a very low cut-off integration frequency, which would otherwise be required in order to achieve a very large attenuation of those undesirable spectral components. Therefore, the equivalence of large capacitors (for achieving very low cut-off frequencies) can be achieved, but without large capacitors. Having higher cut-off frequencies allows for the feedback circuits 126, 127 to settle more rapidly, resulting in a rapid removal of the undesirable spectral components.

Figure 5:
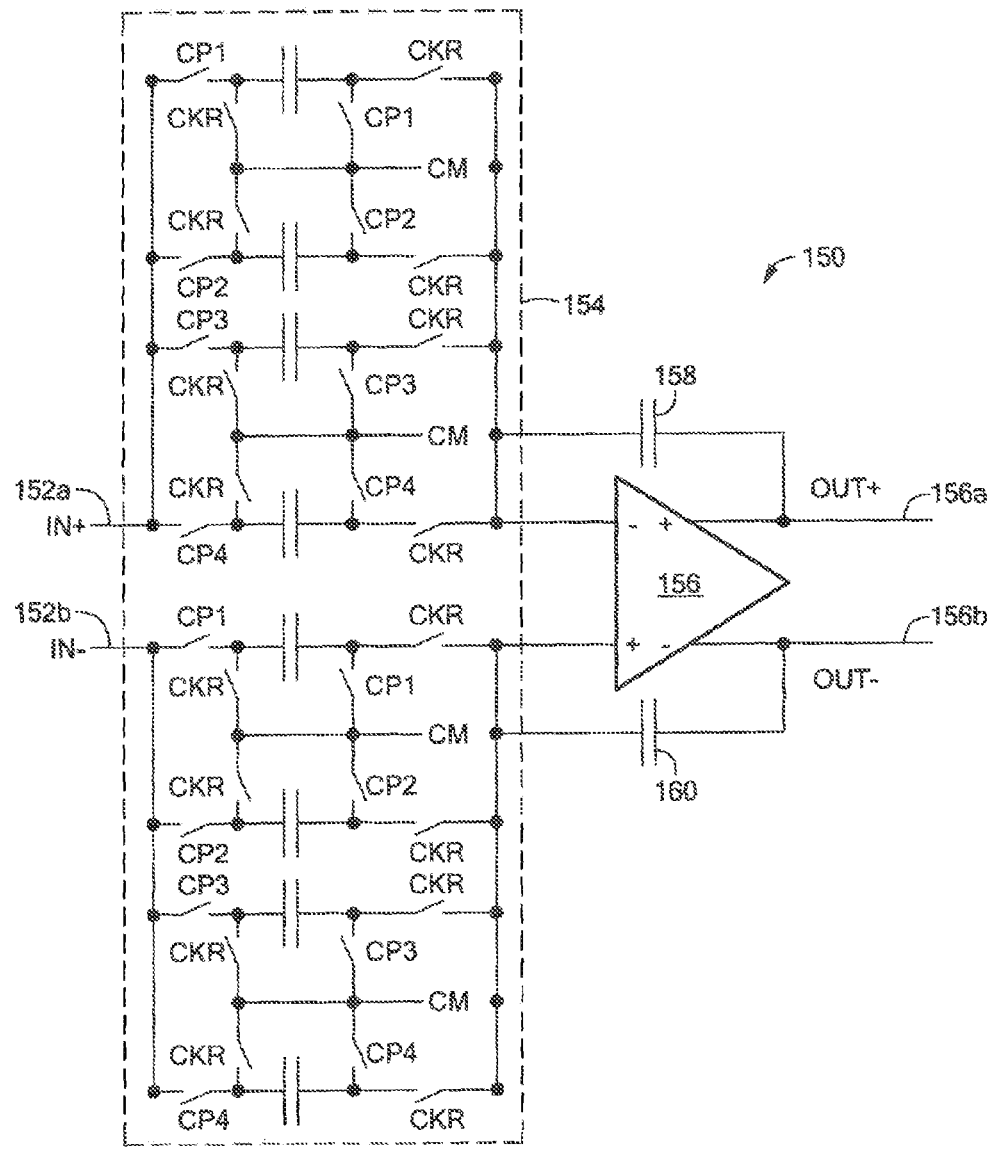
FIG. 5 is a block diagram of a four-phase switched capacitor notch filter integrator circuit.

Referring now to FIG. 5, a four-phase switched capacitor notch filter integrator 150 is representative of the N-phase switch capacitor notch filter integrator 130 of FIG. 4 for the case of 4× chopping, where N=4. The switched capacitor notch filter integrator 150 is coupled to receive a differential input signal 152a, 152b. The switched capacitor notch filter integrator 150 includes a plurality of switches and a plurality of capacitors 154 all coupled is shown, and coupled to input nodes of an amplifier 156. Some of the plurality of switches are controlled by a so-called "redistribution" clock signal, CPR. Other ones of the plurality of switches are controlled by a sample clock signals, CP1, CP2, CP3, CP4. Each one of the sample clock signals has the same frequency but occurs a different phase as described more fully below in conjunction with FIG. 5A.

The amplifier 156 is configured to generate a differential output signal 156a, 156b, which can be the same as or similar to the differential output signal 130a, 130b of FIG. 4.

A capacitor 158 is coupled between an input node of the amplifier 156 and the output signal 156a. A capacitor 160 is coupled between another input node of the amplifier 156 and the output signal 156b.

Figure 5A:
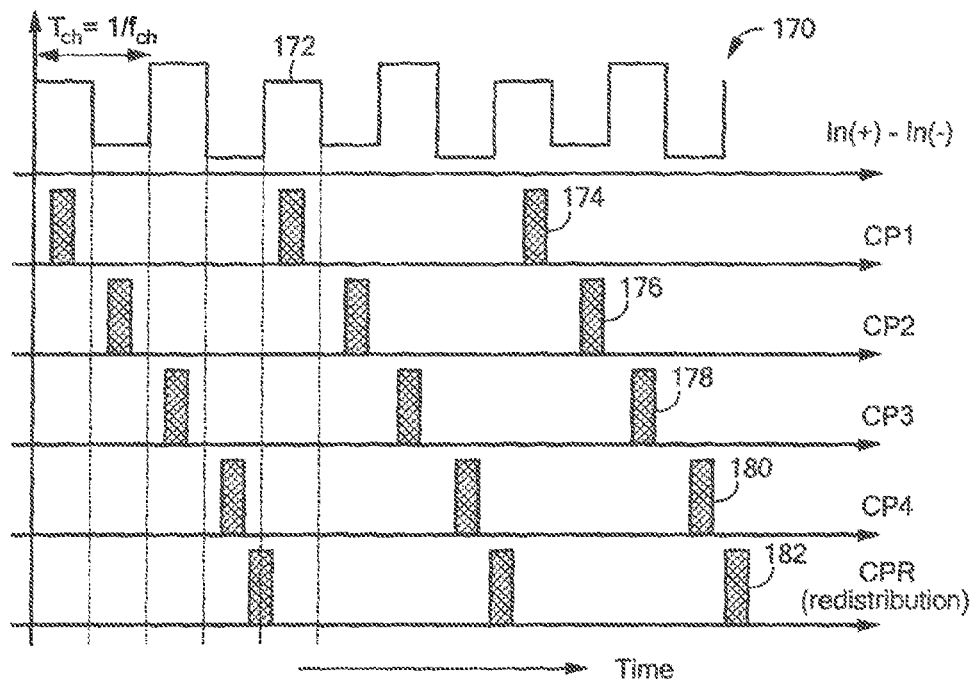
FIG. 5A is a series of graphs showing clock signals associated with the four-phase switched capacitor notch filter integrator circuit of FIG. 5.

Referring now to FIG. 5A, a graph 170 has a horizontal axis with a scale in units of time in arbitrary units and a vertical axis with a scale in units of volts in arbitrary units. A signal 172 can be the same as or similar to the differential input signal 152a, 152b of FIG. 5.

Clock signals 174, 176, 178, 180 can be the same as or similar to the sampling clock signals, CP1, CP2, CP3, CP4 of FIG. 5 and the clock signals 140 of FIG. 4. The clock signals 174, 176, 178, 180 are shown as pluralities of dark boxes representing sampling periods, however, the dark boxes are representative of switch closures of respective ones of the pairs of switches in FIG. 5. As described above the sample clock signal 140 is actually four clock signals, each at the same frequency, and each at a different phase.

A clock signal 182 can be the same as or similar to the redistribution or averaging clock signals 136, 142 of FIG. 4. The clock signal 182 is shown as a plurality of dark boxes, however, the dark boxes are representative of switch closures of respective ones of the switches in FIG. 5. In operation, at times when the redistribution clock signal 182 is high, samples associated with each one of the sample clock signals 174, 176, 178, 180 are averaged.

Figure 5B:
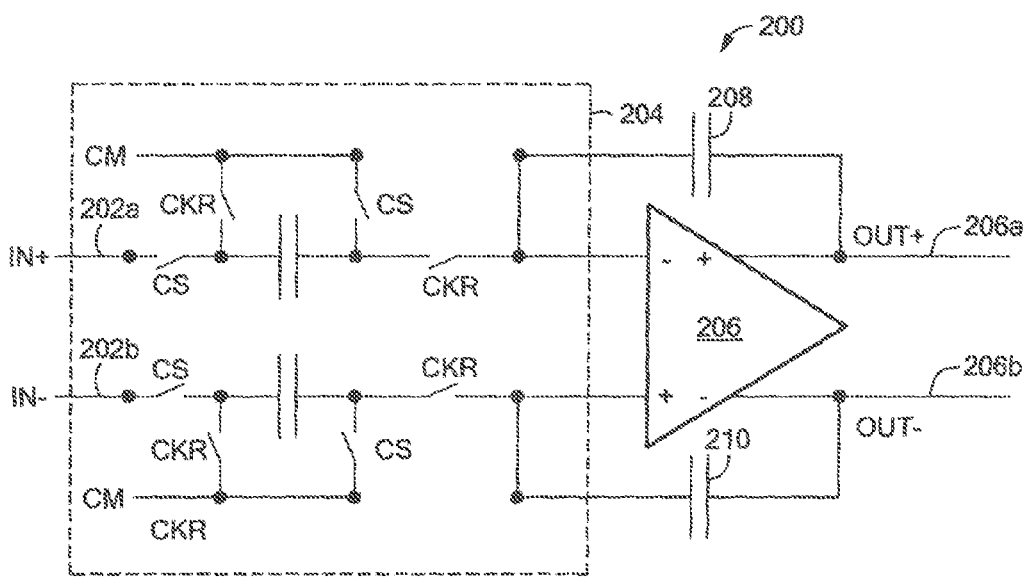
FIG. 5B is a block diagram of a conventional switched capacitor integrator circuit.

Referring now to FIG. 5B, a conventional switched capacitor integrator can be the same as or similar to the integrators 78, 84 of FIG. 3. The switched capacitor integrator 200 is coupled to receive a differential input signal 202a, 202b. The switched capacitor integrator 200 includes a plurality of switches and a plurality of capacitors 204 all coupled is shown, and coupled to input nodes of an amplifier 206. Some of the plurality of switches are controlled by a redistribution clock signal, CKR. Other ones of the plurality of switches are controlled by a sample clock signal, CS. In some embodiments, the sample clock signal and the redistribution clock signal have the same frequency but different phases.

The amplifier 206 is configured to generate a differential signal 206a, 206b, which can be the same as or similar to the differential signals 78a, 78b and 84a, 84b of FIG. 3.

A capacitor 208 is coupled between an input node of the amplifier 206 and the output signal 206a. A capacitor 210 is coupled between another input node of the amplifier 206 and the output signal 206b.

Figure 5C:
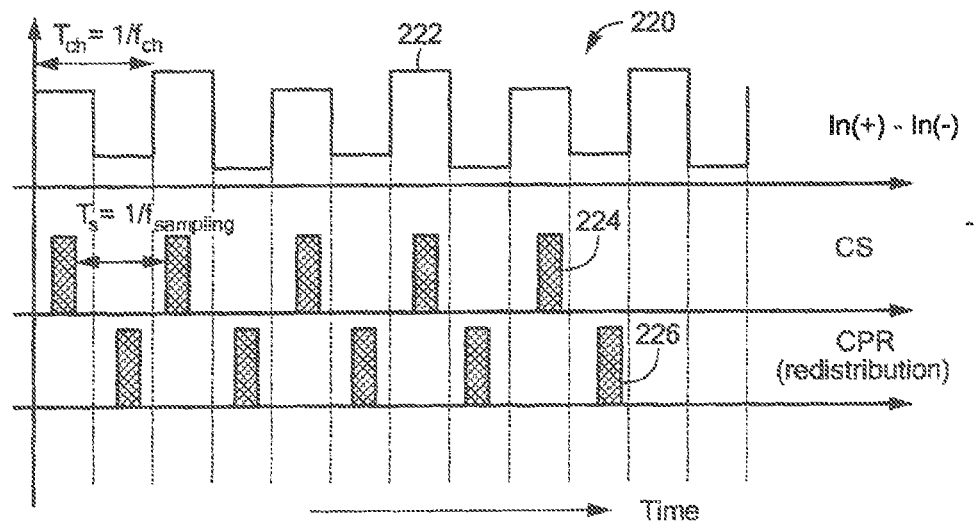
FIG. 5C is a series of graphs showing clock signals associated with the switched capacitor integrator circuit of FIG. 5B.

Referring now to FIG. 5C, a graph 220 has a horizontal axis with a scale in units of time in arbitrary units and a vertical axis with a scale in units of volts in arbitrary units. A signal 222 can be the same as or similar to the differential input signal 202a, 202b of FIG. 5B.

A clock signal 224 can be the same as or similar to the clock signal, CS, of FIG. 5B and the clock signals 98, 102 of FIG. 3. The clock signals 224 is shown as dark boxes, however, the dark boxes are representative of switch closures of respective ones of the switches in FIG. 5B.

A clock signal 226 can be the same as or similar to the redistribution or averaging clock signals 99, 103 of FIG. 3. The clock signal 226 is shown as dark boxes, however, the dark boxes are representative of switch closures of respective ones of the switches in FIG. 5B.

Figure 5D:
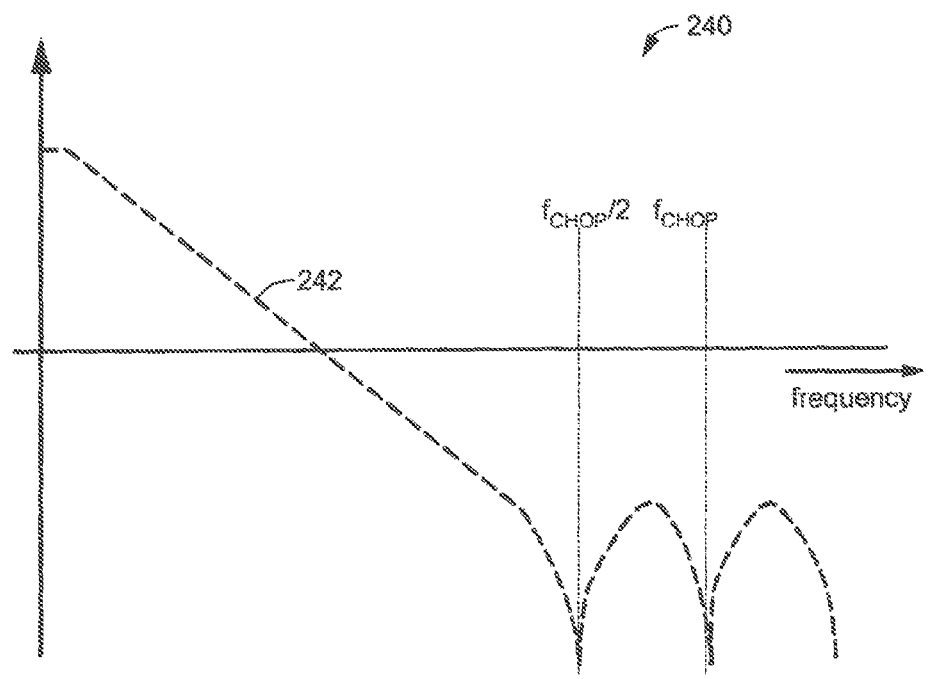
FIG. 5D is a graph showing an exemplary transfer function that can be associated with the four-phase switched capacitor notch filter integrator circuit of FIG. 5.

Referring now to FIG. 5D, a graph 240 includes a horizontal axis in units of frequency and a vertical axis in non-dimensional units. A curve 242 is indicative of a transfer function, and, in particular, a transfer function of the four-phase notch filter switched capacitor integrator 150 of FIG. 5 and, in four phase chopping arrangements, of the N-phase notch filter switched capacitor integrator 130 of FIG. 4. It will be understood that the transfer function of this integrator, and of any integrator, has a high gain at DC, and rolls off at higher frequencies. This particular transfer function rolls off at frequencies above DC at a rate generally of about 20 dB per decade. The transfer function 242 is representative of a sin x/x (or sin c) function. A first null is shown at a frequency of fchop/2.

It will be understood that a frequency of the first null can be controlled by the redistribution clock signal 182 of FIG. 5A, the redistribution clock signal, CKR, of FIG. 5, and the redistribution clock signal 142 of FIG. 4.

It will also be understood that the curve 242 has a shape generally representative of a closed loop transfer function, for example, a closed loop transfer function of the feedback circuits 126, 127 of FIG. 4. However, the closed loop transfer function will generally have a lower gain at DC than an open loop transfer function of the N-phase notch filter switched capacitor integrator 130.

Similar circuits and transfers functions can be used for any of the N-phase notch filter switched capacitor integrators of FIG. 4.

FIGS. 6-23 show frequency domain graphs representative of signals labeled A-R in FIGS. 3 and 4, for the case of 4× chopping of the Hall Effect element 52.

In each graph, three spectral lines are shown at three respective different frequencies and amplitudes. For clarity, the spectral lines are representative of the magnetic field sensors of FIGS. 3 and 4 being exposed to an extra magnetic field with only a DC magnetic field component. However, if the magnetic field sensors are exposed to an AC external magnetic field, each one of the spectral lines will broaden into spectral bands.

At various points in the circuit three of FIGS. 3 and 4, and in various corresponding ones of FIGS. 6-23, positions of the three spectral lines change. However, the spectral lines can be identified by way of their respective amplitudes no matter at what frequency or position they are found. Gain of amplifiers is not represented in FIGS. 6-23 for clarity, in order to keep the spectral lines at the same amplitude so that they can be readily identified.

In some of the graphs, spectral lines are shown as dashed lines rather than solid lines. The dashed lines indicate that those spectral lines change with time for a time period beginning at a power up of the magnetic field sensors 50, 120 of FIGS. 3 and 4, respectively. Some of the dashed spectral lines occur at full magnitude when the magnetic field sensors 50 and 120 of FIGS. 3 and 4 first power up, and thereafter, the dashed spectral lines diminish toward zero amplitude. Others of the dashed spectral lines occur at very low magnitude when the magnetic field sensors 50 and 120 of FIGS. 3 and 4 first power up, and thereafter, the dashed spectral lines increase in magnitude. This effect is described more fully below in conjunction with FIGS. 24-26.

Figure 6:
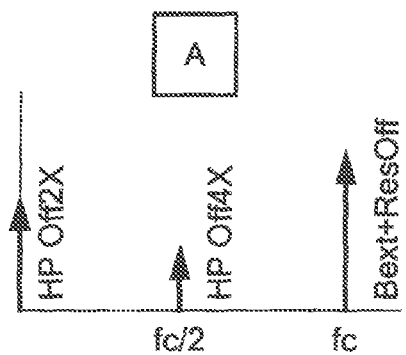
FIGS. 6-23 graphs showing spectral content of signals at various points within the magnetic field sensors of FIGS. 3 and 4, in particular, for a four-phase chopping arrangement and for the magnetic field sensed by the magnetic field sensors that contains only a DC component.

Referring now to FIG. 6, the signal labeled A in FIGS. 3 and 4, due to chopping of the Hall element 52, has three spectral lines (an also higher order spectral lines, not shown, but at lower amplitudes). A spectral line at a frequency, fc=fchop, is a desired signal, Bext+Resoff. The desired signal is representative of an external magnetic field, here a DC magnetic field, sensed by the magnetic field sensors of FIGS. 3 and 4.

Spectral lines within the signal labeled A at DC and at a frequency, fc/2, are undesirable. The spectral line at DC is representative of one aspect of Hall element DC offset, HP Off2X (see, e.g., FIG. 2, signal 20). The spectral line at a frequency fc/2 is representative of another aspect of Hall element DC offset, HP Off4X (see, e.g., FIG. 2, signal 24).

Figure 7:
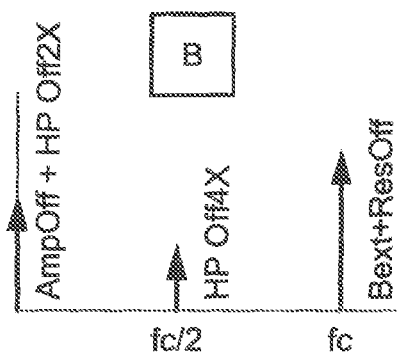

Referring now to FIG. 7, the signal labeled B in FIGS. 3 and 4 has essentially the same spectral content as the signal labeled A. The signal labeled A has passed through the amplifier 56 of FIGS. 3 and 4 to result in the signal labeled B. As described above, gain of amplifiers is not included in the graphs.

Figure 8:
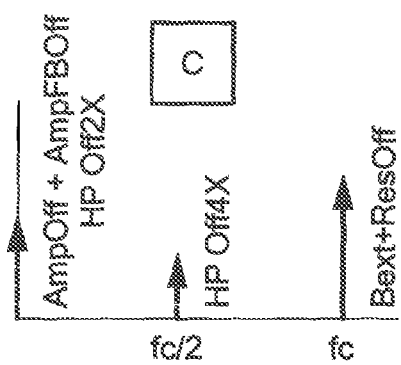

Referring now to FIG. 8, the signal labeled C in FIGS. 3 and 4 also has the same spectral content as the signals labeled A and B. However, the signal labeled C experiences spectral lines that change in amplitude for a time period after power up, i.e., spectral lines at DC and at a frequency of fc/2.

Figure 9:
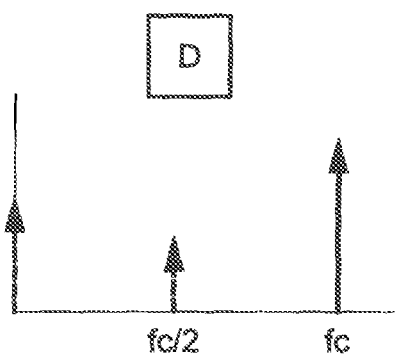

Referring now to FIG. 9, the signal labeled D in FIGS. 3 and 4 also has the same spectral content as the signals labeled A, B, and C. The signal labeled C has passed though one more amplifier 62 to result in the signal labeled D. As described above, gain of amplifiers is not included in the graphs.

Figure 10:
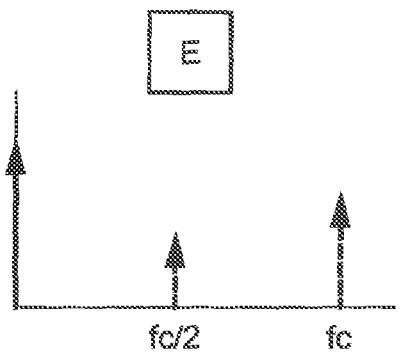

Referring now to FIG. 10, the signal labeled E in FIGS. 3 and 4 has different spectral content than the signal labeled D. The signal labeled D has passed through the switching circuit 64 to result in the signal labeled E. The switching circuit 64 operates to multiplex the signal E with the clock signal 92 at a frequency of fc=fchop. As is known, the multiplexer generates sum and difference products, resulting in the spectral content shown, in which positions of spectral lines have changed.

Figure 11:
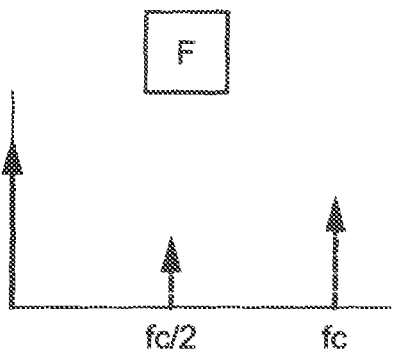

Referring now to FIG. 11, the signal labeled F in FIGS. 3 and 4 has the same spectral content as the signal labeled E. The signal labeled E has passed though one more amplifier 66 to result in the signal labeled F. As described above, gain of amplifiers is not included in the graphs.

Figure 12:
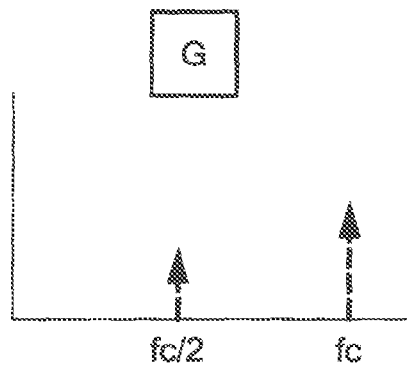

Referring now to FIG. 12, the signal labeled G in FIG. 3 has different spectral content than the signal labeled F. The signal labeled F has passed through capacitors 72, 74 to result in the signal labeled G. The capacitors remove the DC component. In some alternate embodiments, the capacitors 72, 74 are not used.

Figure 13:
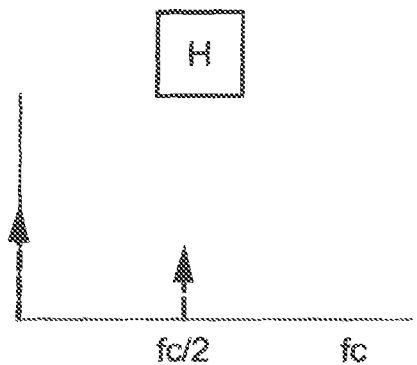

Referring now to FIG. 13, the signal labeled H in FIG. 3 has different spectral content than the signal labeled G. The signal labeled G has passed through the switching circuit 76 to result in the signal labeled H. The switching circuit 76 operates to multiplex the signal labeled G with the clock signal 96 at a frequency of fchop, resulting in the spectral content shown, in which positions of spectral lines have changed.

Figure 14:
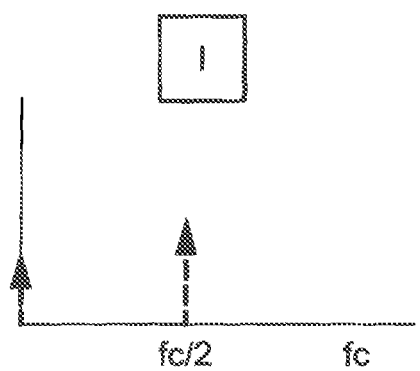

Referring now to FIG. 14, the signal labeled I in FIG. 3 has different spectral content than the signal labeled H. The signal labeled H has passed through the switching circuit 82 to result in the signal labeled I. The switching circuit 82 operates to multiplex the signal labeled H with the clock signal 100 at a frequency of 2fc/N, which is fc/2 for the case of 4× chopping, resulting in the spectral content shown, in which positions of spectral lines have changed.

Figure 15:
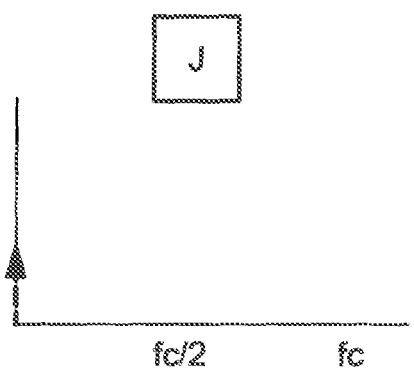

Referring now to FIG. 15, the signal labeled J in FIG. 3 has different spectral content than the signal labeled I. The signal labeled I has passed through the integrator 84, which has high gain at DC and low gain at other frequencies, to result in the signal labeled J. Thus, primarily the DC component of the signal labeled I remains in the signal labeled J.

Figure 16:
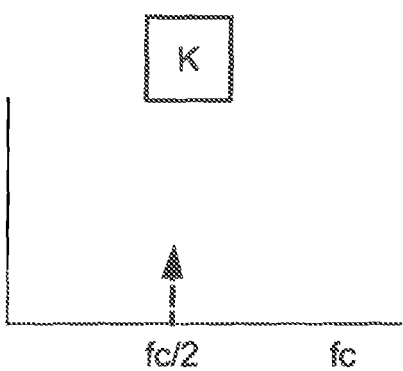

Referring now to FIG. 16, the signal labeled K in FIG. 3 has different spectral content than the signal labeled J. The signal labeled J has passed through the switching circuit 86 to result in the signal labeled K. The switching circuit 86 operates to multiplex the signal labeled J with the clock signal 100 at a frequency of 2fc/N, which is fc/2 for the case of 4× chopping, resulting in the spectral content shown, in which positions of spectral lines have changed, and only one spectral line remains, at a frequency of fc/2. The signal labeled K is summed back (see summation circuits 58, 60 of FIG. 3) into the signal labeled B of FIG. 3 at the proper phase to reduce or eliminate the spectral line in the signal labeled C at the frequency of fc/2.

Figure 17:
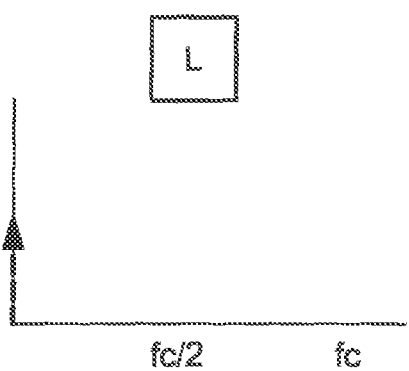

Referring now to FIG. 17, the signal labeled L in FIG. 3 has different spectral content than the signal labeled H by operation of the integrator 78, for reasons described above. The signal labeled L has spectral content primarily at DC. The signal labeled L is summed back (see summation circuits 58, 60 of FIG. 3) into the signal labeled B of FIG. 3 at the proper phase to reduce or eliminate the spectral line in the signal labeled C at DC.

By way of the signals labeled K and L, both of the undesirable spectral lines in the signal labeled C of FIG. 3 are progressively removed during a time period following power up, leaving the desired spectral line at the frequency of fc in the signal labeled C. It should be appreciated that the signal labeled F in FIG. 3 can be the output signal from the magnetic field sensor 50 of FIG. 3. Note that in FIG. F, the position of the desired spectral line has changed to DC.

As described above, the graphs of FIGS. 6-23 are representative of the magnetic field sensors of FIGS. 3 and 4 being exposed to a DC external magnetic field. If instead, the magnetic field sensors were exposed to an AC magnetic field, all of the spectral lines shown in the graphs would broaden the spectral bands. Thus, for the case of an AC external magnetic field, the remaining spectral line, shown to be at DC, would instead be a spectral band centered at DC.

Figure 18:
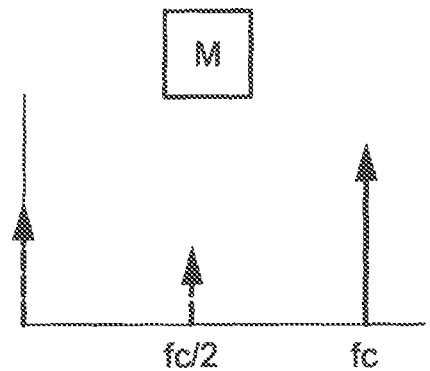

Referring now to FIG. 18, the signal labeled M in FIGS. 3 and 4 has different spectral content than the signal labeled F. The signal labeled F has passed through the switching circuit 70 to result in the signal labeled M. The switching circuit 70 operates to multiplex the signal labeled F with the clock signal 94 at a frequency of fc, resulting in the spectral content shown, in which positions of spectral lines have changed.

FIGS. 19-23 are representative of signals that appear only in FIG. 4.

Figure 19:
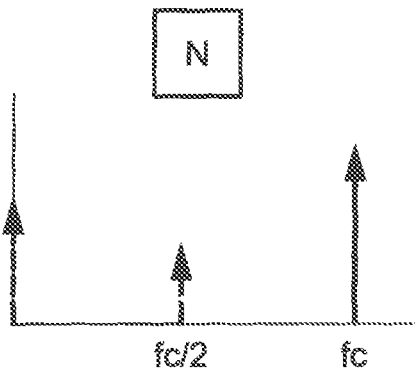
Figure 20:
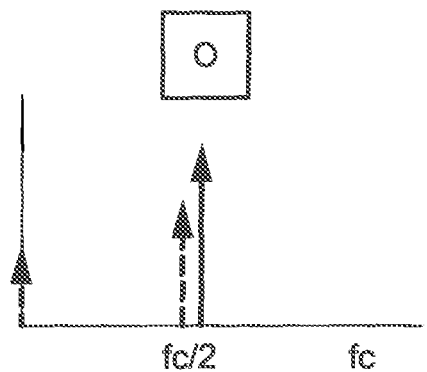

Referring now to FIG. 19, the signal labeled N in FIG. 4 has different spectral content than the signal labeled F. The signal labeled F has passed through the switching circuit 122 to result in the signal labeled N. The switching circuit 122 operates to multiplex the signal labeled F with the clock signal 133 at a frequency of fc, resulting in the spectral content shown, in which positions of spectral lines have changed Referring now to FIG. 20, the signal labeled O in FIG. 4 has different spectral content than the signal labeled N. The signal labeled N has passed through the switching circuit 128 to result in the signal labeled O. The switching circuit 128 operates to multiplex the signal labeled N with the clock signal 138 at a frequency of 2fc/N, which is fc/2 for the case of 4× chopping, resulting in the spectral content shown, in which positions of spectral lines have changed.

Figure 21:
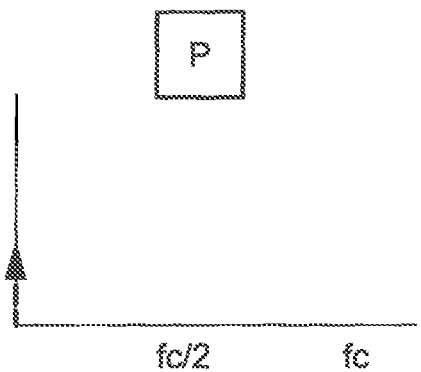

Referring now to FIG. 21, the signal labeled P in FIG. 4 has different spectral content than the signal labeled O. The signal labeled O has passed through the N-phase (here four-phase) switched capacitor notch filter integrator 130, which has high gain at DC and low gain at other frequencies, to result in the signal labeled P. Thus, primarily the DC component of the signal labeled O remains in the signal labeled P.

Figure 22:
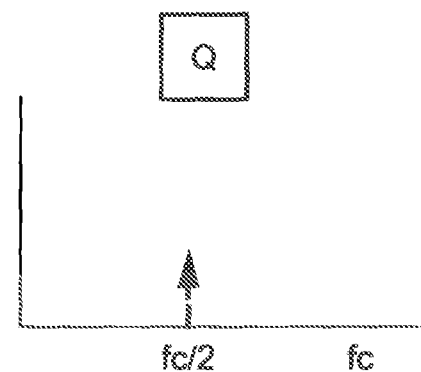

Referring now to FIG. 22, the signal labeled Q in FIG. 4 has different spectral content than the signal labeled P. The signal labeled P has passed through the switching circuit 132 to result in the signal labeled Q. The switching circuit 132 operates to multiplex the signal labeled P with the clock signal 144 at a frequency of 2fcN, which is fc/2 for the case of 4× chopping, resulting in the spectral content shown, in which positions of spectral lines have changed.

Figure 23:
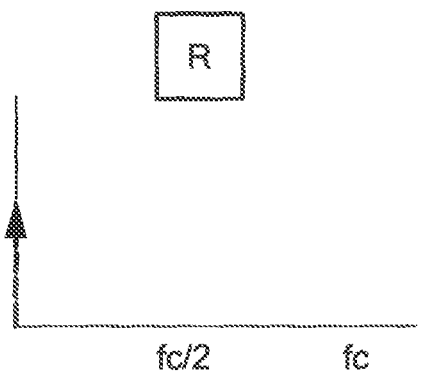

Referring now to FIG. 23, the signal labeled R in FIG. 4 has different spectral content than the signal labeled N. The signal labeled R has passed through the N-phase (here two-phase) switched capacitor notch filter integrator 124, which has high gain at DC and low gain at other frequencies. Thus, primarily the DC component of the signal labeled N remains in the signal labeled R.

By way of the signals labeled Q and R, both of the undesirable spectral lines in the signal labeled C of FIG. 4 are progressively removed, leaving the desired spectral line at the frequency of fc. It should be appreciated that the signal labeled F of FIG. 4 can be the output signal from the magnetic field sensor 120 of FIG. 4. Note that in the signal labeled F, the position of the desired spectral line has moved to DC.

Figure 24:
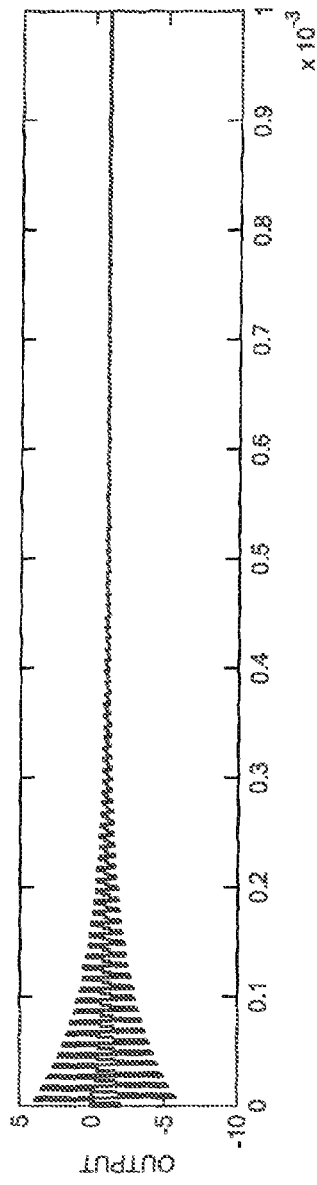
FIG. 24 is a graph showing a time behavior of an output signal generated by the magnetic field sensors of FIGS. 3 and 4 for a time period beginning at startup of the magnetic field sensors and for the magnetic field sensed by the magnetic field sensors the contains only the DC component.
Figure 25:
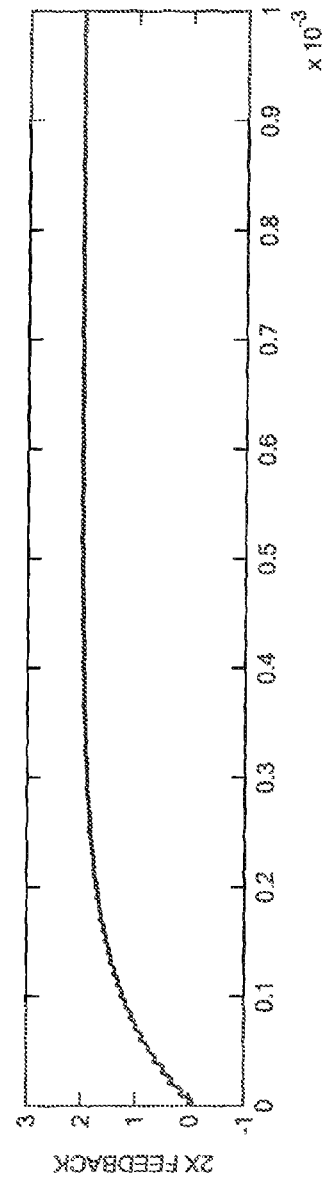
FIG. 25 is a graph showing a time behavior of one of the signals within the magnetic field sensors of FIGS. 3 and 4 for a time period beginning at startup.
Figure 26:
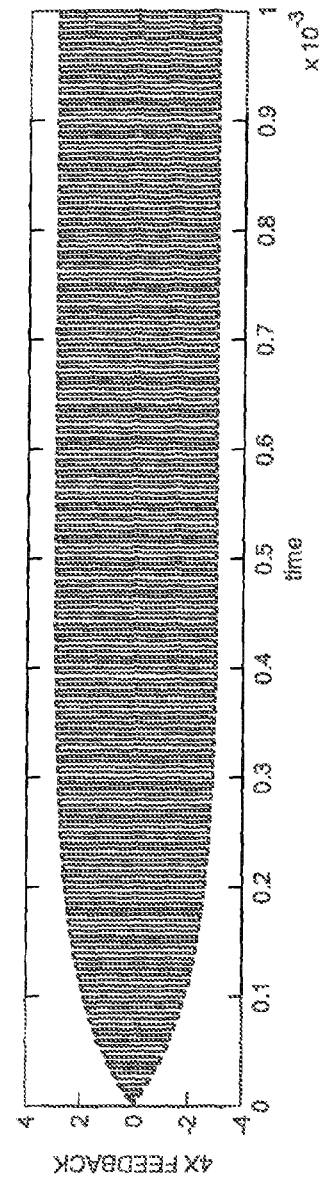
FIG. 26 is a graph showing a time behavior of another one of the signals within the magnetic field sensors of FIGS. 3 and 4 for a time period beginning at startup.

FIGS. 24-26 show the above-described start up (i.e., power up) behavior of the magnetic fields sensors 50, 120 of FIGS. 3 and 4, respectively, for the case where the magnetic field sensors are exposed to a DC magnetic field. FIGS. 23-24 of each show graphs having horizontal axes with scales in units of time and vertical axes with scales in units of voltage.

Referring now to FIG. 24, a signal is representative of the signal labeled F of FIGS. 3 and 4, i.e., the output signal of the magnetic field sensors. It can be seen that the output signal has undesirable spectral content for some time period beginning at time zero (i.e., power up) and extending out to about 0.4 milliseconds. This time period is determined by a variety factors, for example, transfer function characteristics of the integrators of FIGS. 3 and 4. It is desirable that this time be short.

Referring now to FIG. 25, a signal is representative of the signals labeled L and R of FIGS. 3 and 4, respectively. As described above, the signals labeled L and R are DC feedback signals, and they increase with time so as to cancel undesirable DC spectral components in the primary circuit path 112 of FIGS. 3 and 4.

Referring now to FIG. 26, a signal is representative of the signals labeled K and Q of FIGS. 3 and 4, respectively. As described above, the signals labeled K and Q have spectral content at a frequency of fc/2, and they increase with time so as to cancel undesirable spectral components at the frequency of fc/2 in the primary circuit path 112 of FIGS. 3 and 4.

It will be appreciated that, by using techniques described above to remove undesirable spectral components, the primary circuit path 112 of FIGS. 3 and 4 does not need to use filters. As described above, filters tend to slow the response time of magnetic field sensors. Thus, using the circuits and techniques described above, magnetic field sensors can be built that have faster response times.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
    a magnetic field sensing element configured to generate an electronic signal in response to a magnetic field;
    an N-phase modulator coupled to receive the electronic signal and configured to generate a modulated signal having a plurality of frequency components at different frequencies, wherein the plurality of frequency components comprises a plurality of undesirable frequency components and a desirable frequency component, wherein the desirable frequency component comprises a magnetic field signal representative of the magnetic field;
    a primary circuit path coupled to receive the modulated signal and to process the modulated signal to generate an output signal representative of the magnetic field signal; and
    a feedback circuit network coupled at both ends of the feedback circuit network to the primary circuit path and forming a feedback loop, the feedback circuit network configured to generate a plurality of feedback signals, wherein the feedback circuit network comprises a plurality of feedback circuits, each feedback circuit coupled at both ends to the primary circuit path, each feedback circuit configured to generate a different respective one of the plurality of feedback signals, the primary circuit path configured to add each different respective one of the plurality of feedback signals to the primary circuit path to cancel a different respective one of the plurality of undesirable frequency components.

2. The magnetic field sensor of claim 1, wherein, during a first time period, the output signal from the primary circuit path is representative of both the desirable frequency component and of the plurality of undesirable frequency components, and during a second different time period after the first time period, the output signal from the primary circuit path is representative of the desirable frequency component and the plurality of undesirable frequency components are canceled.

3. The magnetic field sensor of claim 1, wherein the feedback circuit network comprises:
    a first switching circuit coupled to receive the output signal from the primary circuit path and configured to generate a first switched signal represented by a respective spectral line changed in position relative to a related spectral line in the output signal from the primary circuit path;
    a first integrator coupled to receive the first switched signal and configured to generate a first one of the plurality of feedback signals.

4. The magnetic field sensor of claim 3, wherein the first integrator comprises a switched capacitor integrator.

5. The magnetic field sensor of claim 3, wherein the first integrator comprises an N-phase switched capacitor notch filter integrator.

6. The magnetic field sensor of claim 3, wherein the first integrator comprises a continuous linear integrator.

7. The magnetic field sensor of claim 3, wherein the feedback circuit network further comprises:
    a second switching circuit coupled to the primary circuit path and configured to generate a second switched signal;
    a second integrator coupled to receive the second switched signal and configured to generate a second integrated signal; and
    a third switching circuit coupled to receive the second integrated signal and configured to generate a second one of the plurality of feedback signals.

8. The magnetic field sensor of claim 7, wherein the magnetic field sensing element comprises a Hall effect element, and wherein the N-phase modulator comprises a chopping circuit.

9. The magnetic field sensor of claim 8, wherein the chopping circuit comprises a 4X chopping circuit.

10. The magnetic field sensor of claim 1, wherein the feedback circuit network further comprises:
    a first switching circuit coupled to the primary circuit path and configured to generate a first switched signal;
    an integrator coupled to receive the first switched signal and configured to generate an integrated signal; and
    a second switching circuit coupled to receive the integrated signal and configured to generate a first one of the plurality of feedback signals.

11. The magnetic field sensor of claim 10, wherein the integrator comprises a switched capacitor integrator.

12. The magnetic field sensor of claim 10, wherein the integrator comprises an N-phase switched capacitor notch filter integrator.

13. The magnetic field sensor of claim 10, wherein the integrator comprises a continuous linear integrator.

14. The magnetic field sensor of claim 10, wherein the magnetic field sensing element comprises a Hall effect element, and wherein the N-phase modulator comprises a chopping circuit.

15. The magnetic field sensor of claim 14, wherein the chopping circuit comprises a 4X chopping circuit.

16. A method of processing a signal in a magnetic field sensor, comprising:
    generating a magnetic field signal with a magnetic field sensor in response to a magnetic field;
    modulating the magnetic field signal with an N-phase modulator coupled to receive the magnetic field signal and configured to generate a modulated signal having a plurality of frequency components at different frequencies, wherein the plurality of frequency components comprises a plurality of different undesirable frequency components and a desirable frequency component;

processing the modulated signal with a primary circuit path coupled to receive the modulated signal, the processing operable to generate an output signal representative of the desirable frequency component;

generating, with a feedback circuit network comprising a plurality of different-feedback circuits, a plurality of feedback signals; and adding the plurality of feedback signals to the primary circuit path to cancel the plurality of different undesirable frequency components, each one of the plurality of feedback signals cancelling a different respective one of the plurality of different undesirable frequency components.

17. The method of claim 16, wherein, during a first time period, the output signal from the primary circuit path is representative of both the desirable frequency component and of the plurality of different undesirable frequency components, and during a second different time period after the first time period, the output signal from the primary circuit path is representative of the desirable frequency component and the plurality of different undesirable frequency components are canceled.

18. The method of claim 16, wherein the generating the plurality of feedback signals comprises:
with a first switching circuit, generating a first switched signal represented by a respective spectral line changed in position relative to a related spectral line at an input of the first switching circuit;
receiving, with a first integrator, the first switched signal; and
generating, with the first integrator, a first one of the plurality of feedback signals, wherein the adding the plurality of feedback signals comprises adding the first one of the plurality of feedback signals to the primary circuit path cancelling a first one of the plurality of different undesirable frequency components.

19. The method of claim 18, wherein the first integrator comprises a switched capacitor integrator.

20. The method of claim 18, wherein the first integrator comprises an N-phase switched capacitor notch filter integrator.

21. The method of claim 18, wherein the first integrator comprises a continuous linear integrator.

22. The method of claim 18, wherein the generating the plurality of feedback signals further comprises:
with a second switching circuit coupled to the primary signal path, generating a second switched signal;
receiving, with a second integrator, the second switched signal;
generating, with the second integrator, a second integrated signal;
receiving, with a third switching circuit, the second integrated signal; and
with the third switching circuit, generating a second one of the plurality of feedback signals, wherein the adding the plurality of feedback signals comprises adding the second one of the plurality of feedback signals to the primary circuit path cancelling a second one of the plurality of undesirable frequency components.

23. The method of claim 16, wherein the generating the plurality of feedback signals comprises:
with a first switching circuit coupled to the primary circuit path, generating a first switched signal;
generating, with an integrator coupled to the first switching circuit, an integrated signal; and
generating, with a second switching circuit coupled to the integrator, a first one of the plurality of feedback signals.

24. The method of claim 23, wherein the integrator comprises a switched capacitor integrator.

25. The method of claim 23, wherein the integrator comprises an N-phase switched capacitor notch filter integrator.

26. The method of claim 23, wherein the integrator comprises a continuous linear integrator.

* * * * *

UNITED STATES PATENT AND TRADEMARK OFFICE
CERTIFICATE OF CORRECTION

PATENT NO. : 9,817,083 B2
APPLICATION NO. : 13/542103
DATED : November 14, 2017
INVENTOR(S) : Hernan D. Romero Page 1 of 1

It is certified that error appears in the above-identified patent and that said Letters Patent is hereby corrected as shown below:

In the Specification

Column 7, Line 49, delete "74" and replace with --74$a$--.

Column 8, Line 14, delete "un-sampled" and replace with --unsampled--.

Column 12, Line 16, delete "an" and replace with --and--.

Column 13, Line 48, delete "FIG. F" and replace with --FIG. 3--.

In the Claims

Column 17, Line 8, delete "different-feedback" and replace with --different feedback--.

Signed and Sealed this
Eighth Day of January, 2019

Andrei Iancu
*Director of the United States Patent and Trademark Office*